US 7,108,476 B2

(12) United States Patent
Astegno et al.

(10) Patent No.: US 7,108,476 B2
(45) Date of Patent: Sep. 19, 2006

(54) METHOD AND DEVICE FOR CHANGING A SEMICONDUCTOR WAFER POSITION

(75) Inventors: Pierre Astegno, Saint Jory (FR);
Ekaterina Esteve, Toulouse (FR);
Alain Gaudon, Launac (FR)

(73) Assignee: Recif Technologies SAS, Aussonne (FR)

( * ) Notice: Subject to any disclaimer, the term of this patent is extended or adjusted under 35 U.S.C. 154(b) by 0 days.

(21) Appl. No.: 10/693,296

(22) Filed: Oct. 24, 2003

(65) Prior Publication Data

US 2004/0091343 A1   May 13, 2004

Related U.S. Application Data

(63) Continuation of application No. 09/674,613, filed on Nov. 3, 2000, now Pat. No. 6,652,216.

(30) Foreign Application Priority Data

May 5, 1998   (FR) ................... 98 05660

(51) Int. Cl.
*B25J 15/00*   (2006.01)
*B25J 15/10*   (2006.01)
*B65B 35/00*   (2006.01)

(52) U.S. Cl. ................ 414/783; 414/416.01; 414/757; 414/936; 414/744.5; 414/433

(58) Field of Classification Search ................ 294/907, 294/103.1; 414/783, 757, 936, 941, 744.5, 414/433; 901/30
See application file for complete search history.

(56) References Cited

U.S. PATENT DOCUMENTS

| 384,939 | A | 6/1888 | Stollwerck |
| 440,984 | A | 11/1890 | Williams |
| 3,160,295 | A | 12/1964 | Roark |
| 3,165,186 | A | 1/1965 | Zeiter |
| 3,297,134 | A | 1/1967 | Pastuszak |
| 3,480,158 | A | 11/1969 | Pandjiris et al. |
| 3,499,560 | A | 3/1970 | Le Gros |

(Continued)

FOREIGN PATENT DOCUMENTS

DE   30 04 462   8/1981

(Continued)

OTHER PUBLICATIONS

Berstelsen et al. "Semiconductor Transportation Sensing Alignment Technique," IBM Technical Disclosure Bulletin 20:533-534 (1977).

(Continued)

*Primary Examiner*—Eileen D. Lillis
*Assistant Examiner*—Gregory Adams
(74) *Attorney, Agent, or Firm*—Townsend and Townsend and Crew LLP

(57) ABSTRACT

A mechanical apparatus and method are disclosed for orienting and positioning semiconductor wafers while avoiding contamination of elements on the faces thereof, by only contacting the peripheries thereof. The apparatus may include a frame for wafer supports and a semiconductor wafer gripping arm. The gripping arm is mounted on a translator for movement in X, Y, and Z directions to engage and move wafers in, from, and between supports. The gripping arm comprises a rigid structure with a plurality of semiconductor support wheels mounted thereon to support a wafer only around its periphery. A drive wheel is provided to orient a supported wafer rotationally while it is being supported around its periphery. A detector is provided to detect orientation of the wafer relative to a notch or other position mark on its periphery.

31 Claims, 7 Drawing Sheets

U.S. PATENT DOCUMENTS

| | | | |
|---|---|---|---|
| 3,712,483 | A | 1/1973 | Messervey |
| 3,820,647 | A | 6/1974 | Waugh, Jr. et al. |
| 3,972,424 | A | 8/1976 | Levy et al. |
| 3,982,627 | A | 9/1976 | Isohata |
| 4,094,426 | A | 6/1978 | Vogel |
| 4,213,318 | A | 7/1980 | Priebe |
| 4,244,673 | A | 1/1981 | Henderson |
| 4,407,627 | A | 10/1983 | Sato et al. |
| 4,423,998 | A | 1/1984 | Inaba et al. |
| 4,427,332 | A | 1/1984 | Manriquez |
| 4,449,885 | A | 5/1984 | Hertel et al. |
| 4,483,434 | A | 11/1984 | Miwa et al. |
| 4,621,967 | A | 11/1986 | Masada |
| 4,655,584 | A | 4/1987 | Tanaka et al. |
| 4,662,811 | A | 5/1987 | Hayden |
| 4,685,206 | A | 8/1987 | Kobayashi et al. |
| 4,687,542 | A | 8/1987 | Davis et al. |
| 4,691,817 | A | 9/1987 | Haar |
| 4,720,130 | A | 1/1988 | Andou |
| 4,766,322 | A | 8/1988 | Hashimoto |
| 4,775,281 | A | 10/1988 | Prentakis |
| 4,787,814 | A | 11/1988 | Vaerman |
| 4,813,840 | A | 3/1989 | Prabhakar et al. |
| 4,875,824 | A | 10/1989 | Moe et al. |
| 4,887,904 | A | 12/1989 | Nakazato et al. |
| 4,892,455 | A | 1/1990 | Hine |
| 4,944,650 | A | 7/1990 | Matsumoto |
| 5,022,695 | A | 6/1991 | Ayers |
| 5,102,291 | A | 4/1992 | Hine |
| 5,133,635 | A | 7/1992 | Malin et al. |
| 5,265,170 | A | 11/1993 | Hine et al. |
| 5,364,222 | A | 11/1994 | Akimoto et al. |
| 5,445,486 | A * | 8/1995 | Kitayama et al. ...... 414/416.03 |
| 5,511,934 | A | 4/1996 | Bacchi et al. |
| 5,513,948 | A | 5/1996 | Bacchi et al. |
| 5,538,385 | A | 7/1996 | Bacchi et al. |
| 5,697,759 | A | 12/1997 | Bacchi et al. |
| 5,741,113 | A | 4/1998 | Bacchi et al. |
| 5,831,738 | A | 11/1998 | Hine |
| 5,870,488 | A | 2/1999 | Rush et al. |
| 5,917,169 | A | 6/1999 | Poli et al. |
| 5,944,476 | A | 8/1999 | Bacchi et al. |
| 5,970,818 | A * | 10/1999 | Kikuchi et al. ............... 74/526 |
| 5,980,194 | A | 11/1999 | Freerks et al. |
| 6,098,484 | A | 8/2000 | Bacchi et al. |
| 6,105,454 | A | 8/2000 | Bacchi et al. |
| 6,116,848 | A * | 9/2000 | Thomas et al. ............. 414/754 |
| 6,188,323 | B1 | 2/2001 | Rosenquist et al. |
| 6,256,555 | B1 | 7/2001 | Bacchi et al. |
| 6,275,748 | B1 * | 8/2001 | Bacchi et al. ............... 700/275 |
| 6,298,280 | B1 | 10/2001 | Bonora et al. |
| 6,438,460 | B1 | 8/2002 | Bacchi et al. |
| 6,453,214 | B1 | 9/2002 | Bacchi et al. |
| 6,618,645 | B1 | 9/2003 | Bacchi et al. |
| 6,652,216 | B1 | 11/2003 | Astegno et al. |

FOREIGN PATENT DOCUMENTS

| | | |
|---|---|---|
| DE | 235 156 | 4/1986 |
| DE | 236 714 | 6/1986 |
| EP | 376 160 | 12/1989 |
| EP | 0 445 651 | 7/1992 |
| EP | 0 620 584 A1 | 4/1994 |
| EP | 1 078 391 B1 | 5/1999 |
| FR | 2 567 160 | 1/1986 |
| FR | 2 751 769 A1 | 7/1996 |
| GB | 1 457 162 | 7/1974 |
| GB | 2 171 978 | 3/1985 |
| JP | 56-043718 | 4/1981 |
| JP | 56-024921 | 10/1981 |
| JP | 58-090735 | 5/1983 |
| JP | 58-144022 | 8/1983 |
| JP | 58-182846 | 10/1983 |
| JP | 59-104138 | 6/1984 |
| JP | 59-228720 | 12/1984 |
| JP | 61-267611 | 11/1986 |
| JP | 61-291335 | 12/1986 |
| JP | 62-004142 | 1/1987 |
| JP | 62-188642 | 8/1987 |
| JP | 02-122541 | 10/1990 |
| JP | 03-052248 | 6/1991 |
| JP | 03-296244 | 12/1991 |
| JP | 06-345261 | 12/1994 |
| NL | 85564 | 7/1957 |
| RU | 879681 | 7/1981 |
| WO | WO 80/00073 | 1/1980 |
| WO | WO 83/04240 | 12/1983 |
| WO | WO 84/04739 | 12/1984 |
| WO | WO 97/45861 A1 | 12/1997 |
| WO | WO 99/57752 | 11/1999 |

OTHER PUBLICATIONS

Recif SPP12 product.

Declaration of Laurent Moesle for Response to Office Action.

Declaration and SPP 12 product documents, filed in connection with Recif's U.S. Appl. No. 09/674,613, now U.S. Patent No. 6,652,216, Exhibit A of the Declaration of Laurent Moesie for Response to Office Action, 19 pages total.

Proforma Invoice NBRL2494-06-98 and two pages of air bill documents relating to the importation of one unit of the SPP300A product into the United States in Jun. 1998, Exhibit B of the Declaration of Laurent Moesle for Response to Office Action, 3 pages total.

Facsimile correspondence from Hannah Levy dated Jul. 24, 1998, Exhibit C of the Declaration of Laurent Moesle for Response to Office Action, 1 page total.

* cited by examiner

METHOD AND DEVICE FOR CHANGING A SEMICONDUCTOR WAFER POSITION

CROSS-REFERENCES TO RELATED APPLICATIONS

This application is a continuation application of U.S. patent application Ser. No. 09/674,613, filed Nov. 3, 2000 now U.S. Pat. No. 6,652,216, which is incorporated by reference.

BACKGROUND OF THE INVENTION

1. Field of the Invention

The present invention concerns those fields involving the manufacture of electronic components, primarily the fabrication of integrated circuits from substrates or semiconductor wafer materials, such as silicon, more particularly the mechanical procedures and devices used to change the position of at least one semiconductor wafer provided with at least one positioning mark and placed in a support intended to hold a plurality of semiconductor wafers.

2. Discussion of Related Art

The prior art teaches that such methods consist primarily in grasping a semiconductor wafer by one of its faces to change its position, primarily by displacing it from one location to another, whereby devices used to implement these methods comprise means allowing a wafer to be grasped by suction in the central region of one of its faces. Independently of the displacement of the wafers from one location to another, the semiconductor wafers are oriented in such a way that their positioning mark is placed in a predetermined position, which operation may consist, for example, in aligning the positioning marks on all the wafers intended to be moved or situated in a common support.

The disadvantage of the methods and devices of the prior art is that they can lead to contamination of the semiconductor wafers resulting from the grasping of said wafers by one of their faces, which consists of a material that is highly sensitive to various forms of contamination, the risk of contamination being further enhanced by the fact that there is contact between the face and an object. Moreover, the methods and devices according to the prior art require considerable time for the operations of displacement and orientation of one or several semiconductor wafers, these operations being managed independently, which results in longer processing periods for semiconductor wafers and therefore higher processing costs.

We are familiar with document U.S. Pat. No. 5,102,291, which refers to a method and apparatus for orienting a silicon wafer located in a support by grasping its periphery so as to minimize possible contamination from direct contact with its faces. Wafers are grasped one by one between two gripper arms movable in translation with respect to one another along a straight line, which are urged toward each other in translation along the guide direction until the two arms exert pressure against the periphery of the wafer being grasped by means of four pressure wheels that lift the wafer prior to contact of the wheels against the periphery of the wafer, the grasped silicon wafer being capable of being rotationally oriented to a specific position with respect to the support by means of pressure wheels rotating in the plane of the wafer, at least one of which is motorized. Moreover, the apparatus is used to move the grasped wafer in a straight line only because of the two gripper arms. Detection of the desired orientation of the wafer can take place by means of a mechanical, optical, electrical, or other type of sensor. For wafers provided with a notch, the document specifies a pin that is smaller than the notch and which penetrates the notch when the wafer is in a desired position.

We are also familiar with U.S. Pat. No. 5,445,486, which relates to an apparatus for transferring silicon wafers from one support to another by means of a gripper arm inserted between wafers in a support, the gripper arm grasping one or more wafers by the periphery of their bottom surface. The apparatus does not have a means for orienting the transferred wafers.

The intended processing of semiconductor wafers can include any process involving a change in position of a wafer, of several wafers, or of all the semiconductor wafers located in a common support, as, for example, the transfer of wafers from one support to another, the alignment of marks for the purpose of identifying wafers in the support, or even modification of the angular position of the semiconductor wafer found in the support for the placement of marks at a predetermined position.

The present invention proposes to overcome the above disadvantages and provide other advantages. One object of the present invention is to enable the change of position of at least one semiconductor wafer while avoiding any contamination resulting from grasping the wafer by one of its faces and, furthermore, reducing the risks of contamination.

Another object of the present invention is to enable a change of position of at least one semiconductor wafer, thus modifying the orientation of a wafer while another processing operation is taking place, especially the displacement or transfer of the wafer.

Another object of the present invention is to provide increased space within a semiconductor wafer processing station by eliminating the need for specific equipment for the orientation or alignment of positioning marks on wafers.

Another object of the present invention is to enable a plurality of semiconductor wafers to be grasped and oriented, the orientation of the wafers occurring simultaneously and, moreover, simultaneously with another operation, such as the displacement of a plurality of wafers.

BRIEF SUMMARY OF THE INVENTION

More specifically the invention consists in a mechanical method for changing the position of at least one semiconductor wafer provided with at least one positioning mark and placed in a support intended to house a plurality of semiconductor wafers, characterized in that it comprises the following steps:

penetration of said support by means of a gripper arm with a first movement of said arm according to a first direction in space seizure of said at least one semiconductor wafer by the periphery of said wafer with a second movement of said arm according to a second direction in space orientation of said at least one semiconductor wafer, grasped in such a way that said positioning mark is placed in a predetermined position.

Seizure of the semiconductor wafer by its periphery helps reduce contamination of the wafer and helps avoid contamination resulting from grasping a face of the semiconductor wafer, while orientation of the wafer when grasped enables this operation to take place simultaneously with other operations, such as displacement of the wafer. The operation of orienting a wafer when it is being seized helps avoid the use of a specific processing station for orienting the semiconductor wafers, resulting in increased space for processing the wafers.

According to an advantageous characteristic of the invention, the method according to the invention also comprises the following steps:
    withdrawal of said at least one semiconductor wafer from said support with a third movement of said gripper arm along said first direction, opposite said first movement
    displacement of said at least one semiconductor wafer from one location to another in a three-directional or -dimensional space, with movements of said arm being chosen from among the three directions in space, said step consisting of orienting said at least one semiconductor wafer in such a way as to place said positioning mark in a predetermined position, simultaneously with movements of said gripper arm.

According to an advantageous characteristic, the method according to the invention consists in:
    penetration by means of a gripper arm of said support with a first movement of said arm along a first direction in space
    seizure of a plurality of semiconductor wafers by their periphery with a second movement of said arm along a second direction in space
    orientation of said semiconductor wafers in such a way as to align said respective positioning marks of said semiconductor wafers.

According to an advantageous characteristic, the above method also comprises the following steps:
    withdrawal of said plurality of semiconductor wafers from said support with a third displacement of said gripper arm along said first direction, opposite said first displacement
    displacement of said plurality of semiconductor wafers from one location to another in a three-directional or -dimensional space, with displacements of said arm chosen from among the three directions of space, said step consisting in the orientation of said grasped semiconductor wafers in such a way as to align their respective positioning marks and taking place simultaneously with displacements of said gripper arm.

The invention also concerns a device for changing the position of at least one semiconductor wafer provided with at least one positioning mark and placed in a support intended to house a plurality of semiconductor wafers, said device comprising a gripper arm of said at least one semiconductor wafer, means for displacing said gripper arm, said gripper arm comprising:
    means for gripping said at least one semiconductor wafer by its periphery
    means for orienting said at least one semiconductor wafer, said orienting means cooperating with said grasping means to place said positioning mark in a predetermined position said grasping means and said orientation means being arranged on a rigid structure, said grasping means being distributed along the perimeter of the periphery of said at least one semiconductor wafer, and in that said displacement means of said gripper arm comprises means for displacement along three directions in space.

According to an advantageous characteristic, said gripping means comprise:
    means for grasping the periphery of a plurality of semiconductor wafers
    means for orienting said semiconductor wafers, said orienting means cooperating with said means of grasping so as to align said respective positioning marks of said semiconductor wafers.

The invention also concerns a semiconductor wafer gripper arm provided with at least one positioning mark, to realize the seizure of at least one semiconductor wafer placed in a support intended to house a plurality of semiconductor wafers, characterized in that said arm comprises:
    means for grasping the periphery of said at least one semiconductor wafer
    means for orienting said at least one semiconductor wafer, said orienting means cooperating with said grasping means so as to place said positioning mark in a predetermined position
    said grasping means and said orientation means being arranged on a rigid structure, said grasping means being distributed over the perimeter of the periphery of said at least one semiconductor wafer.

According to an advantageous characteristic, said grasping means comprise at least three stops provided respectively with a degree of freedom in rotation and distributed along the perimeter of the periphery of said at least one semiconductor wafer, and said means of orientation comprise a friction-operated drive roller for said at least one semiconductor wafer.

According to another advantageous characteristic, said drive roller consists of one of said three stops that is at least partially a driving element.

According to another advantageous characteristic, said positioning mark is a notch placed along the periphery of said at least one semiconductor wafer, and said three stops comprise respectively two freely rotating adjacent driven rollers.

According to another advantageous characteristic, said driven rollers have respectively at least one first frustoconical contact surface to provide support for said at least one semiconductor wafer by means of a peripheral edge on said wafer.

According to another advantageous characteristic, a generatrix of said at least first frustoconical contact surface forms an angle of between 5° and 45° with a perpendicular to said at least one semiconductor wafer.

According to another advantageous characteristic, said driven rollers have, respectively, a second frustoconical surface whose apex is connected to the base of said first frustoconical surface and whose generatrix forms an angle with a perpendicular to said at least one semiconductor wafer, greater than the angle of the generatrix of said first frustoconical surface.

According to another advantageous characteristic, said means of orientation comprise a first beam capable of being cut whenever said notch is not opposite said first beam, and a detector for detecting when said first beam has been cut.

According to another advantageous characteristic, the gripper arm according to the invention comprises means for locating the position of said at least one semiconductor wafer when it is placed in said support.

According to another advantageous characteristic, said locator means comprise a second beam cooperating with said first beam and a dimension characteristic of said at least one semiconductor wafer to assist in establishing the position of said at least one semiconductor wafer in said support.

According to another advantageous characteristic, said locator means comprise a third beam cooperating with said first or second beams and a dimension characteristic of said at least one semiconductor wafer to assist in establishing the position of said at least one semiconductor wafer in said support when said first or second beam is placed opposite said notch.

According to another advantageous characteristic, the gripper arm according to the invention comprises:

means for grasping a plurality of semiconductor wafers by the periphery means for orienting said grasped semiconductor wafers, said orienting means cooperating with said grasping means to align said respective positioning marks of said semiconductor wafers.

BRIEF DESCRIPTION OF THE DRAWINGS

A clearer idea of the invention will be obtained and other characteristics and advantages will appear after reading the description that follows the examples of various embodiments of the methods, devices, and gripper arm according to the invention, together with the attached drawings, which examples are given purely for illustrative purposes and without in any way limiting the scope of the invention.

DETAILED DESCRIPTION OF THE INVENTION

Figure 1A:
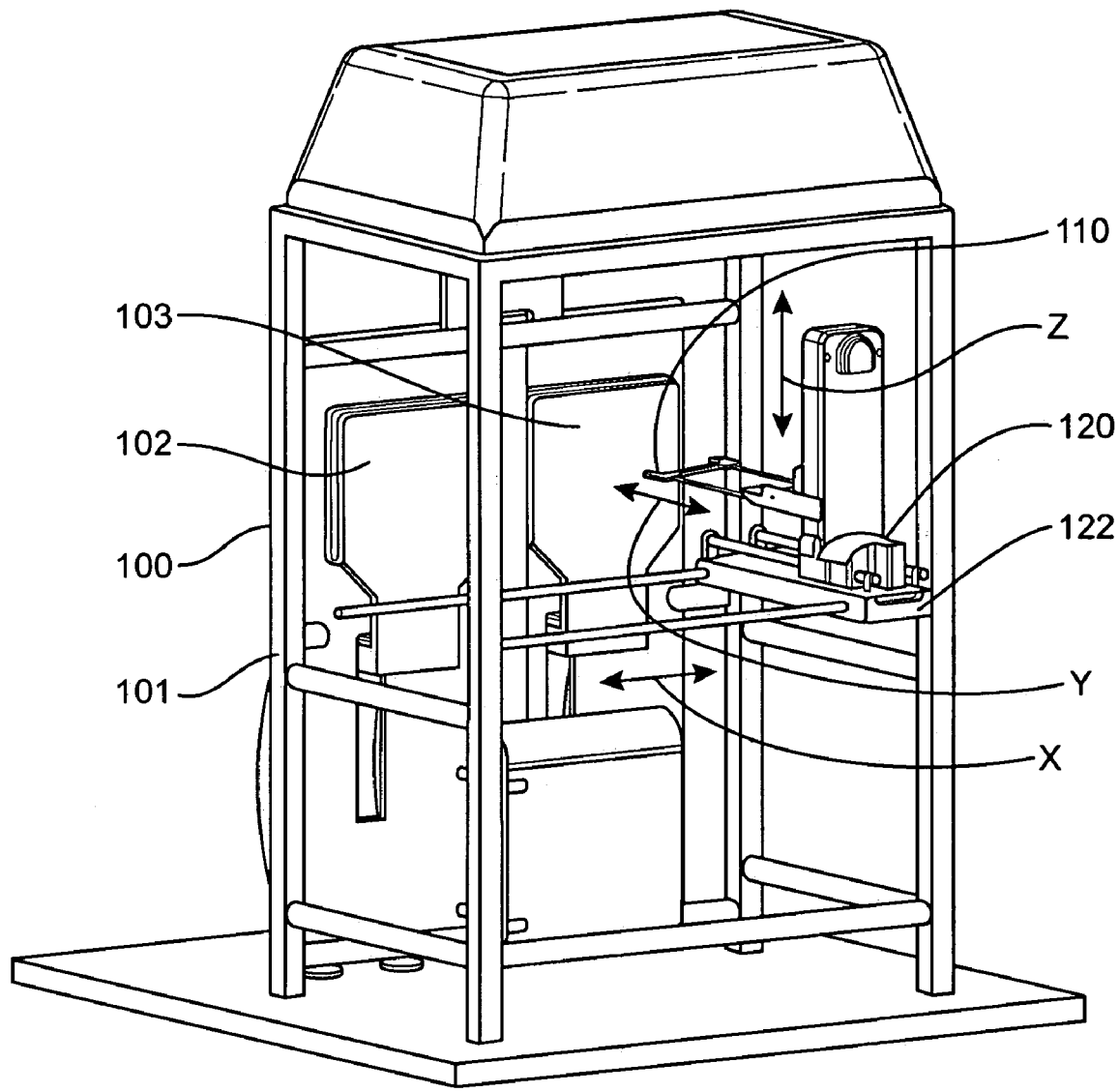
FIG. 1A is a perspective drawing of an example of an embodiment of a device according to the invention used to change the position of at least one semiconductor wafer.

Device 100, shown in FIGS. 1A and partially in 1B, used to change the position of semiconductor wafers equipped respectively with a positioning mark and placed in a support (not shown) intended to house a plurality of semiconductor wafers, comprises semiconductor wafer gripping means 110, means 120 for moving gripping means 110. Gripping means 110 will be explained in detail below with the help of FIGS. 2 to 6 and comprise means 5 for grasping the semiconductor wafer by its periphery, means 6 for orienting the semiconductor wafer in cooperation with grasping means 5 so as to place the positioning mark in a predetermined position.

Device 100 comprises a framework 101 on which are affixed two supports for semiconductor wafers (not shown). The two supports are affixed respectively to attachment plates (not shown), placed, for example, on each side of one another and in line with doors 102 and 103, and having wafers placed horizontally on top of one another in respective compartments in the support. Device 100 can be used to transfer semiconductor wafers from one support to another while enabling the placement of the respective marks on these wafers in a predetermined position. To this end gripping means 110 are connected to displacement means 120 in such a way that they are mobile in three dimensions X, Y, and Z of space, as shown in FIGS. 1A and partially in 1B.

Gripping means 110, placed opposite a first support attached, for example, in line with door 103, are used to select the semiconductor wafer to be grasped in this support, by means of a displacement along the Z axis, to penetrate the support through displacement along the Y axis, to grasp the wafer through upward displacement along the Z axis without striking a wafer possibly situated above, to withdraw the wafer from the support by means of an opposite displacement along Y, to use the displacements in X and Z to position gripper means 110 opposite the second support placed in line with door 102 and the appropriate receptacle in this support for the grasped wafer.

During these displacements, the semiconductor wafer will be advantageously oriented to a predetermined position, for example, so that all the semiconductor wafers have their respective marks aligned. Note that, depending on the need, the device shown in FIG. 1A can be used to orient wafers in a support without transferring them to another support. To do so we place gripper means 110 in position to grasp a wafer in its support, that is, place means 110 beneath the wafer to be grasped, grasp the wafer by means of an upward displacement along Z without striking a wafer possibly situated above, and orient the wafer in the chosen position before again placing it in the same receptacle, then withdraw gripper means 110.

Figure 1B:
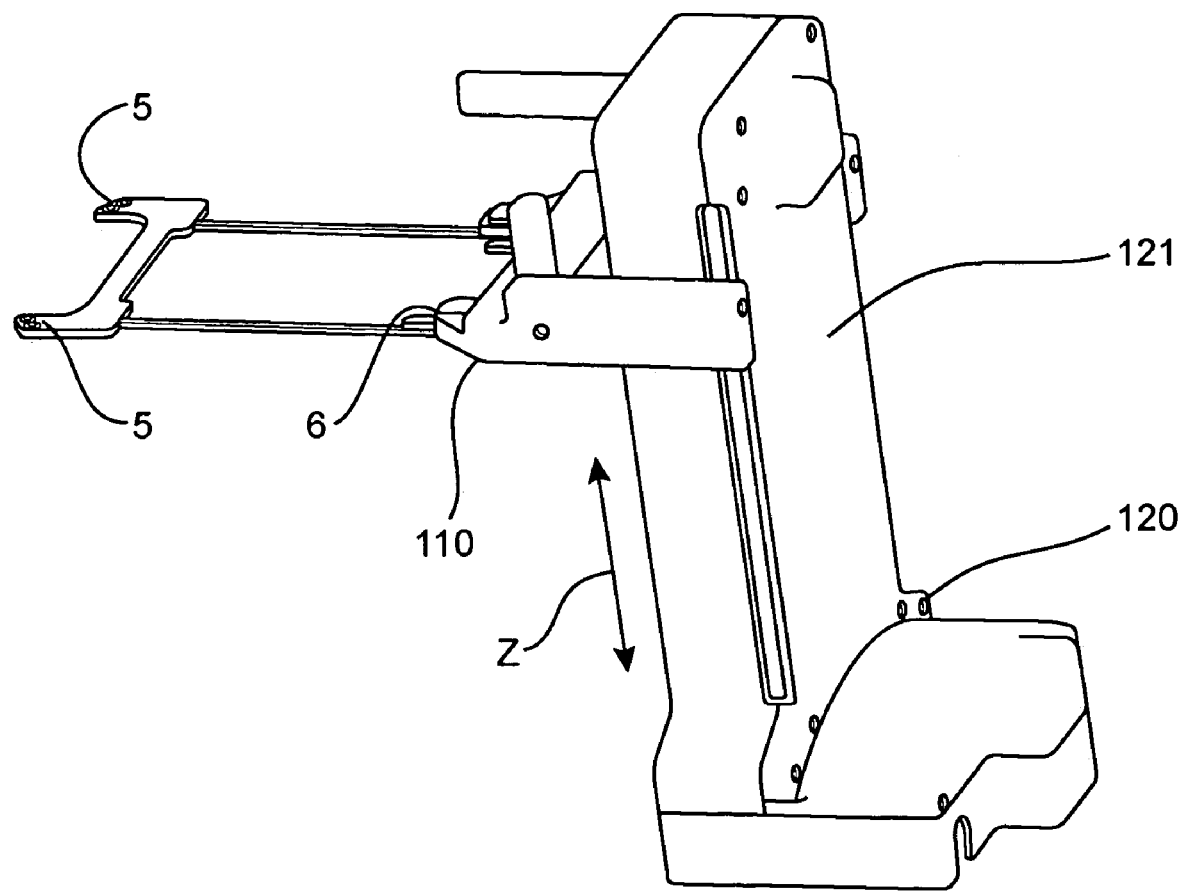
FIG. 1B is a perspective drawing of an enlarged detail of FIG. 1A.

FIG. 1B illustrates gripper means 110 connected to a first part 121 of displacement means 120 in such a way as to enable displacement of the gripper means with a degree of freedom in translation along axis Z. This first part 121 of the displacement means is connected through a degree of freedom in translation along the Y axis to a second part 122 of displacement means 120, itself connected through a degree of freedom in translation along the Y axis to framework 101 of device 100, as shown in FIG. 1A.

According to an alternative not shown, gripper means can comprise means for grasping a plurality of semiconductor wafers by their periphery and means for orienting the grasped semiconductor wafers in cooperation with grasping means to align the respective positioning marks of said semiconductor wafers. This alternative can be obtained by replacing, in device 100 shown, gripper means 110 by the gripper arm shown in FIG. 7 and described below.

Figure 2:
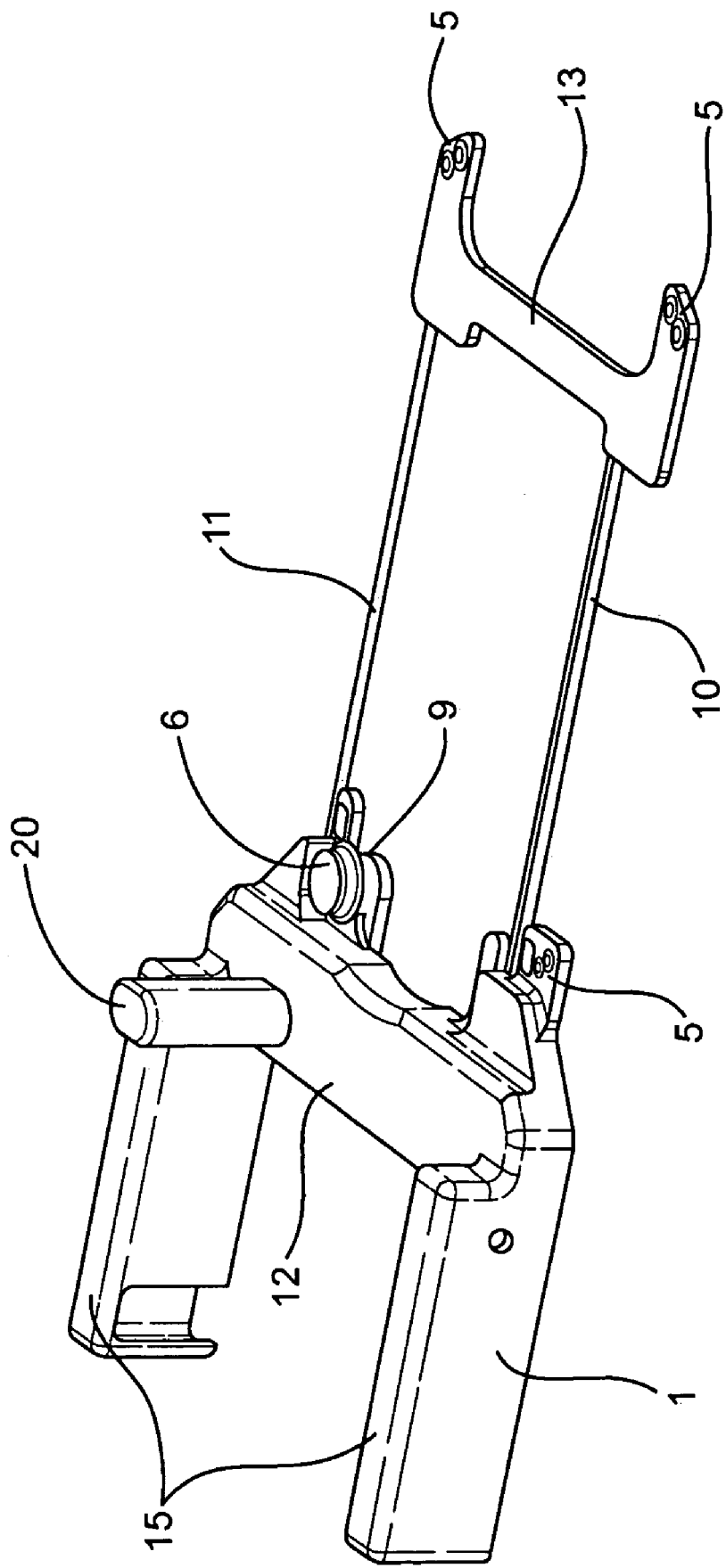
FIG. 2 is a perspective drawing of a first example of an embodiment of a gripper arm according to the invention.
Figure 3:
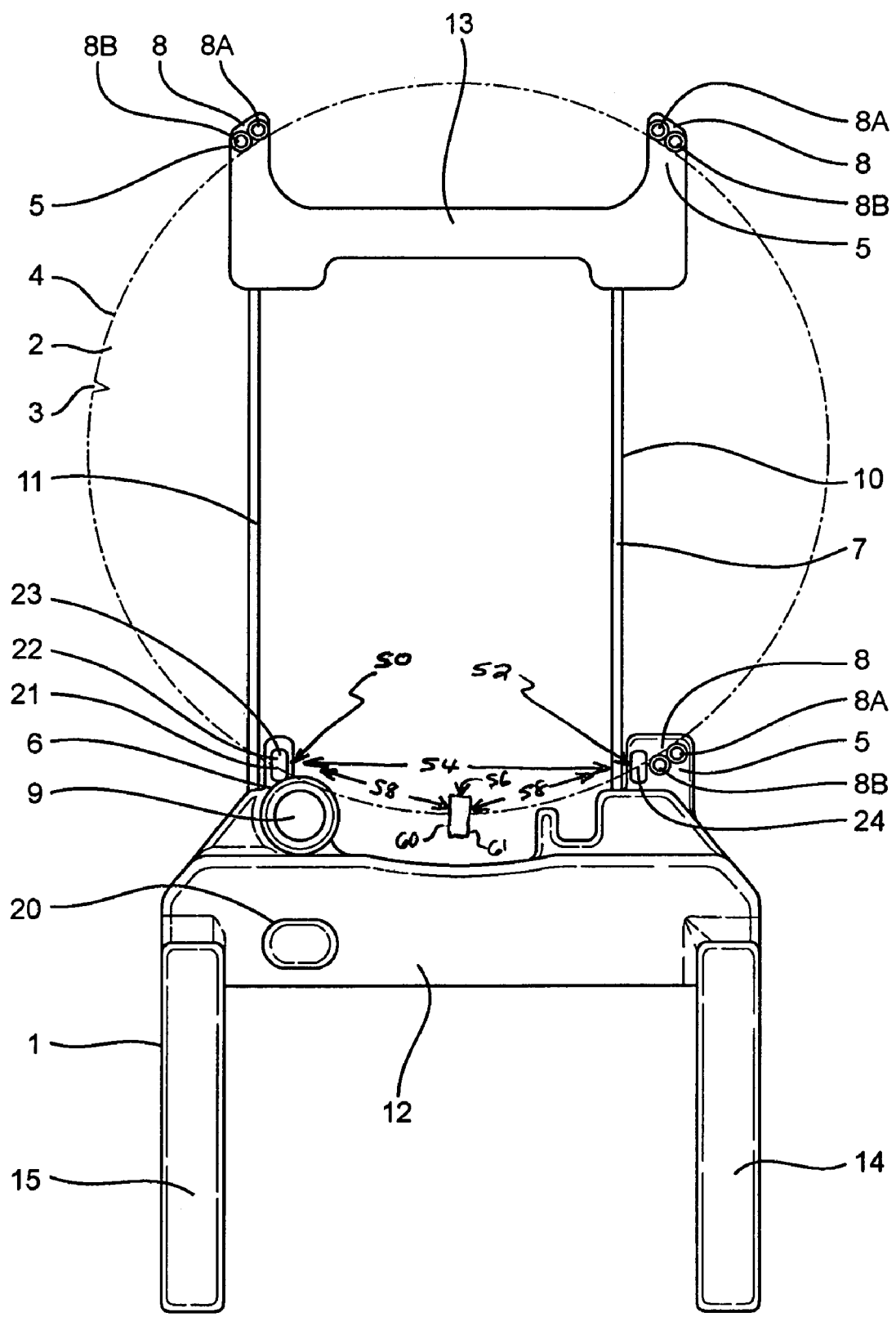
FIG. 3 is a top view of the example shown in FIG. 2.
Figure 4:
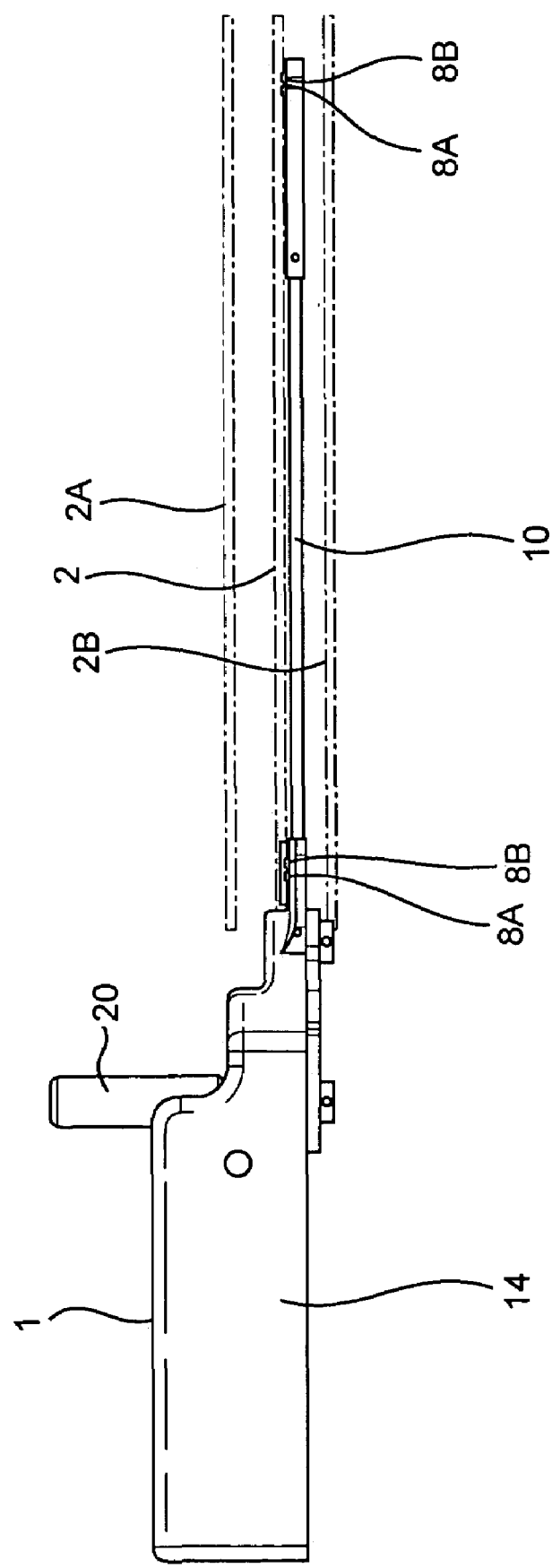
FIG. 4 is a side view of the example shown in FIG. 2.

It should be noted that gripper arm 1 shown in FIGS. 2 to 4 constitutes gripper means 110 of device 100 shown in FIGS. 1A and partially in 1B.

Gripper arm 1 shown in FIGS. 2 to 4 is used to grasp disc-shaped semiconductor wafer 2, placed in a support (not shown) intended to house a plurality of similar semiconductor wafers. Semiconductor wafers 2 are provided respectively with positioning mark 3, essentially having the shape of notch 3, formed on periphery 4 of wafer 2. By periphery 4 of semiconductor wafer 2 we refer to the surface formed by the wafer section, including the two terminating edges of this surface. This surface formed by the section can, for example, be cylindrical or appreciably assume the shape of an exterior circular half-torus. Alternatively, the periphery of the wafer can comprise the upper and lower annular surfaces of the extremities of the wafer, having the shape of a thin crown.

Gripper arm 1, shown in FIGS. 2 to 4, comprises means 5 for grasping the periphery of semiconductor wafer 2, means 6 for orienting the semiconductor wafer 2 in cooperation with grasping means 5 to place positioning mark 3 in a predetermined position, as explained below.

Grasping means 5 and orientation means 6 are arranged on rigid structure 7, enabling its at least partial insertion between two successive wafers placed in a support, for example, as shown in FIG. 4 between wafers 2 and 2B, and represented by a dashed line. Upper wafer 2A, shown with a dashed line, represents a semiconductor wafer placed in the support (not shown) that is not struck when wafer 2 is grasped. Grasping means advantageously comprise three stops 8 provided respectively with a degree of freedom in rotation and distributed about the perimeter of the periphery 4 of wafer 2 and means of orientation 6 comprising a wafer 2 friction drive roller 9.

Rigid structure 7 can, for example, assume the shape of a U profile, at the base of which are located two stops 8, the third stop 8 being arranged on one 10 of the arms of the U, and drive roller 9, being arranged on the other 11 arm of the U, as shown in FIG. 3. A support bar 12 can connect the branches of the U at midheight, as shown in FIG. 3. The shape of rigid structure 7 can vary extensively and the structure can be partly inserted between two successive wafers in such a way that grasping means 5 can grasp a wafer by its periphery. The rigid structure can also enable orientation of the grasped wafer without excessive deformation of the thin part of its extremity before being inserted between two wafers. To obtain an efficient gripper arm, we choose a structure 7 providing excellent strength with minimal weight. Arms 10 and 11 of the U, which are intended to be able to penetrate between two successive wafers, can advantageously consist of a metal material, and parts 12 and 13 joining the arms, as well as extremities 14 and 15 of the arms of the U not penetrating between the semiconductor wafers, can consist of a rigid plastic material.

Figure 6:
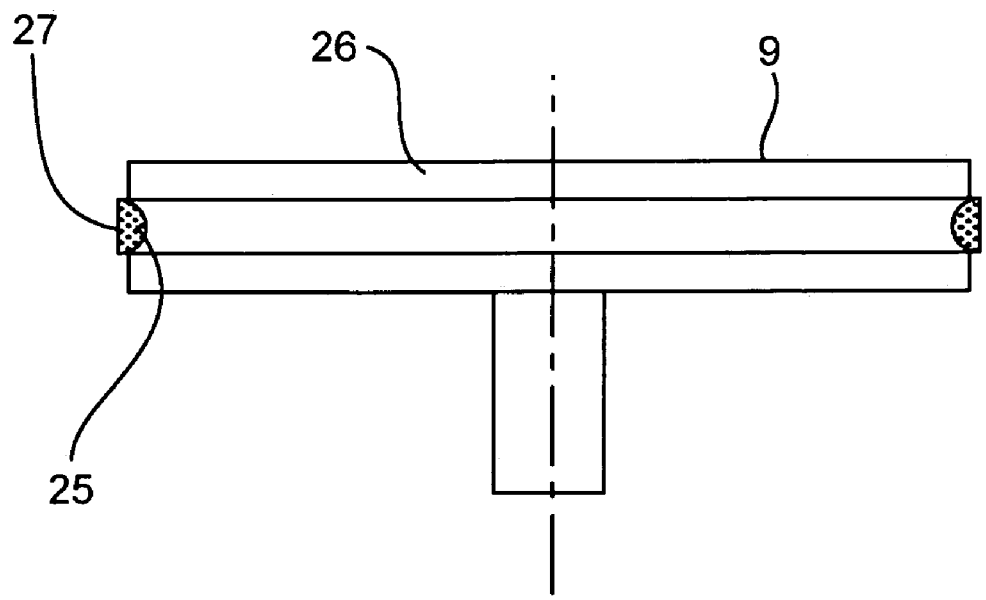
FIG. 6 is a second enlarged detail, providing a partial cutaway of the example shown in FIG. 2.

Friction drive roller 9 has a friction drive band capable of acting on the periphery of semiconductor wafer 2 to drive the latter by angular displacement, preferably through adhesion to at least part or all of a generatrix of the surface forming the periphery 4 of wafer 2, to obtain a good coefficient of friction. Drive band 27 on roller 9 can be realized, for example, by means of an O-ring 25 made of an elastic material, preferably hard, for example, one with a Shore hardness rating of 70 to 80, mounted on drive wheel 26, as shown in FIG. 6. O-ring 25 will preferably be machined to have a cylindrical drive surface.

Drive roller 9 is rotationally driven by motor 20 placed on a rigid part of the arm, for example, on support bar 12, as shown in FIGS. 2 to 4. The transmission of rotational movement between motor 20 and roller 9 can occur through use of a drive belt, gear mechanism, or something similar.

The drive roller can, alternatively, consist of one of the three stops 8, which would then serve as a drive mechanism, at least partially. In this case (not shown) the drive stop would supply angular displacement to the semiconductor wafer, rotational in the case shown, and also assist, in cooperation with the two other stops, in grasping the semiconductor wafer and ensuring the static equilibrium of said wafer. Stop 8 as a drive mechanism would have an appropriate drive band, for example, as described above for drive roller 9.

The three stops 8 advantageously and respectively comprise two driven rollers 8A and 813, adjacent and rotationally free, as shown in FIG. 3. This is done to prevent notch 3, constituting the positioning mark of wafer 2, from interfering with the driving force of the drive roller or the static equilibrium of the wafer when notch 3 is near stop 8 during rotation of the wafer or when the notch is located opposite stop 8 when the wafer is grasped in the support (not shown). The drive rollers are positioned in such a way that their respective contact surfaces with wafer 2 are tangent to the surface of the wafer section. Thus, if notch 3 falls opposite one of three stops 8A or 813, the adjacent stop, 8B or 8A respectively, will supply static and dynamic equilibrium for the wafer. In the situation described above whereby one of stops 8 serves as a driving force, a single roller 8A or 8B would become the driver, the other would be driven.

In the example shown the axes of rotation of driven rollers 8A and 8B and drive roller 9 are perpendicular to the horizontal plane defined by semiconductor wafer 2. We can easily envisage axes having another direction, based on the contact profile of the rollers on the wafer, in such a way that said rollers do not come into contact with either face of the semiconductor wafer.

Figure 5:
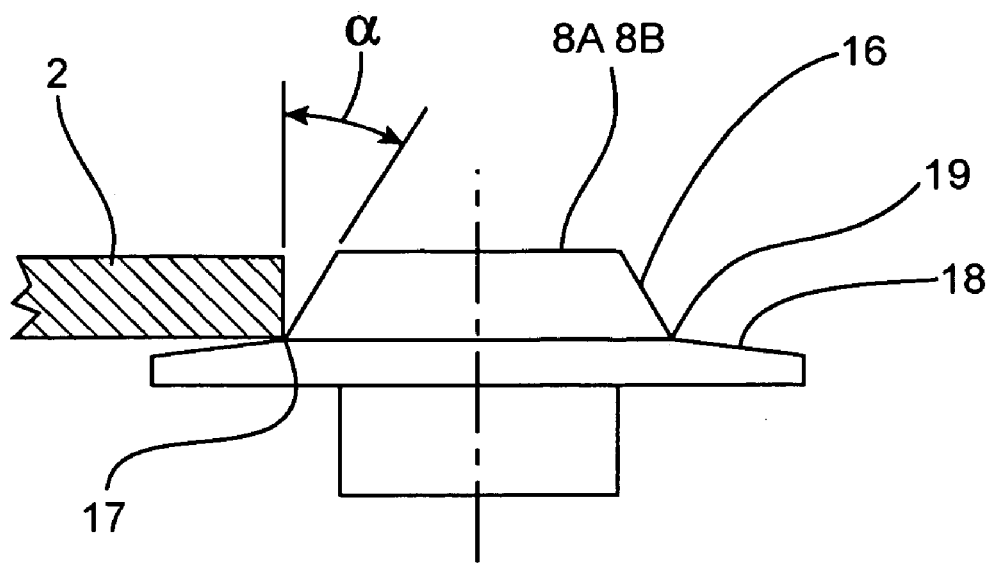
FIG. 5 is a first enlarged detail, providing a side view of the example shown in FIG. 2.

Driven roller 8A or 8B, as shown in FIG. 5, advantageously has a first frustoconical contact surface 16 to enable contact of semiconductor wafer 2 by means of peripheral edge 17 of said wafer. In FIG. 5 roller 8A or 8B is shown in side view and is designed to grasp a wafer placed appreciably or exactly horizontally. Advantageously, a generatrix of first 16 frustoconical contact surface forms an angle $\alpha$ of between 5° and 45° with a perpendicular to semiconductor wafer 2. Advantageously, a driven roller 8A or 8B has a second 18 frustoconical surface whose apex 19 is connected to the base of the first 16 frustoconical surface and whose generatrix forms an angle with a perpendicular to semiconductor wafer 2 that is greater than angle a of the generatrix of the first 16 frustoconical surface. Alternatively, apex 19 of second frustoconical surface 18 of each stop 8A, 8B may present a horizontal annular plane surface (not shown) having the shape of a crown of minimal radial thickness, enabling the wafer to rest on the annular extremity of its lower surface.

It should be noted that other types of surface of revolution could be employed to replace frustoconical surfaces 16 and 18, described, for example, by the first and second surfaces of revolution formed by a curvilinear generatrix resulting in concave, convex, or other surfaces, for example.

The height of first 16 frustoconical contact surface will be defined in accordance with the available height between two successive wafers, the inclination based on angle a of the generatrix of surface 16, and the precision of the relative position of the gripper arm with respect to a wafer before it is grasped, so that the grasped wafer rests preferably against one of the first 16 frustoconical surfaces or the first and second 18 frustoconical surfaces of driven rollers 8A and 8B. For example, for a given height of first 16 frustoconical surface, based on the available space between two successive wafers in the wafer support, the length of the horizontal projection of the generatrix of the first frustoconical surface must be greater or equal to the possible radial positioning error of the arm with respect to the semiconductor wafer.

Driven rollers 8A and 8B are preferably realized using a rigid plastic material and will have low rotational inertia so they can easily be driven in rotation through friction by the semiconductor wafer. Rollers 8A and 8B shall, therefore, preferably be mounted on structure 7 by means of bearings (not shown).

It should be noted that driven rollers 8A and 8B, shown in FIGS. 2 to 5, are provided to enable seizure of a wafer arranged horizontally, as described above. However, ways of grasping wafers placed in another position, vertical for example, can also be envisaged. In this case the rollers should have means for preventing the wafer from freeing itself from the grasping means under the effect of gravity or movement of the gripper arm, such as, for example, a third frustoconical surface (not shown) symmetric with the second frustoconical surface with respect to the plane of the wafer, one of three stops 8 being then, for example, movably mounted on rigid structure 7 to enable the wafer to free itself of the third frustoconical surface and the movable stop to come into contact with the wafer section so said wafer has only one degree of freedom in rotation.

Means of orientation 6 of the gripper arm shown in FIGS. 2 to 4 advantageously comprise a first beam 21 capable of being cut whenever notch 3 of wafer 2 is not opposite beam 21, and cutoff detector 23 of first beam 21. Beam 21 can, for example, be a preferably vertical beam of light emitted at a first selected location 50 by light-emitting diode 22 and the detector 23 a photosensitive cell placed opposite the light-emitting diode. Beam 21 can be placed in such a way that, during angular displacement of wafer 2 from the effect of drive roller 9, beam 21 can traverse notch 3 until it strikes photosensitive cell, beam 21 being in the opposite case cut by wafer 2. When the position of notch 3 has been identified by reception of beam 21 on photosensitive cell, wafer 2 is oriented by drive roller 9 with the desired angular value to place mark 3 in a predetermined position. Operation of roller 9 and photosensitive cell will at least be advantageously operated and controlled by a central unit (not shown) advantageously automated as a function of the operations to be carried out.

The gripper arm shown in FIGS. 2 to 4 advantageously comprises means 21, 24 for identifying the position of semiconductor wafer 2 when it is placed in a support (not shown). The locator means provide optimal positioning of the gripper arm before seizure of semiconductor wafer 2. Identification consists in locating any two points on the periphery 4 of wafer 2 as it is grasped, for example, by means of the two beams 21 and 24 placed on structure 7 of the arm, and respectively describing the two points in a horizontal plane, as shown in FIG. 3 in the plane of the drawing. Beam 24 can, for example, be a light beam emitted by a light-emitting diode and the detector a photosensitive cell placed opposite the emitting diode. Locator means advantageously comprise first 21 beam and second 24 vertical beam placed at a selected location 52 a predetermined distance 54 cooperating with the first beam and a characteristic dimension of semiconductor wafer 2, in the example the outside diameter of the wafer, to establish the position, within a horizontal plane, of the semiconductor wafer in the support (not shown).

The two points on the periphery of wafer 2 are located through small approaching movements of the arm containing beams 21 and 24 so it is positioned suitably for grasping the wafer. The two distinct beams 21 and 24 are used to locate the chord of an arc on the circular periphery of wafer 2 once the beams are cut by the periphery of the wafer, which said chord, combined with knowledge of the diameter of this circular part of the wafer, can be used to determine the position of the wafer and place the arm in an appropriate relative position for grasping the wafer between stops 8, as explained above.

It should be noted that beam 21, used as means for orienting the wafer, is also advantageously used as a locating means to simplify the gripper arm. It is of course possible alternatively to use the two distinct beams as means of orientation and location respectively.

Alternatively and advantageously, locating means comprise a third beam (not shown) from a third optical emitter 60 and sensed by a third optical detector 61 positioned at a selected location 56 a predetermined distance 58 from said first and second optical detectors cooperating with the first 21 or second 24 beam and a dimension characteristic of the semiconductor wafer, its outside diameter in the example, to enable us to establish the position of the semiconductor wafer in its support when the first or second beam is placed opposite the notch used as a positioning marker. To this end the third beam is placed in any position that can be used to obtain the chord of an arc on the periphery of the wafer, in combination with that of the first or second beam, which is not placed opposite the notch, and determine the configuration of two points of a chord of an arc on the periphery of the wafer. In effect the notch generally penetrates the wafer by a non-negligible length and could consequently result in incorrect measurement of the arc and thus of the position of the wafer. The third beam is used to ensure that at least two beams will not be opposite the notch when obtaining a chord. The third beam can be realized similarly to the two first.

The gripper arm shown in FIGS. 2 to 4 operates as follows: The arm is introduced into a support containing semiconductor wafers whose position we wish to modify, for example, as described above with the help of FIGS. 1A and 1B. The approach of the arm toward the wafer is realized by locating means, also as described above, in such a way that the arm is placed in a position such that its upward movement results in seizure of the wafer between rollers 8A and 8B of the arm. During seizure, the wafer must rest on at least the first frustoconical surfaces 16 of a part of rollers 8A, 8B in such a way that said wafer centers itself by gravity or, once set in angular movement by the drive roller, appreciably or exactly at the apex 19 of the second frustoconical surface 18 of each driven roller. Thus the wafer preferably rests on stops 8A and 8B by its lower peripheral edge 17, as shown in FIG. 5. Angular movement of the wafer is then initiated by drive roller 9 until notch 3 passes through beam 21 enabling photosensitive cell to be activated, thus enabling us to identify the angular position of the wafer, whose rotation is then realized with respect to this position so as to place the wafer in the position so determined. During rotation of the wafer, it rests on the first frustoconical surfaces 16 of a part of rollers 8A, 8B. When the desired position is reached, the wafer is resting in the support as described above.

Figure 7:
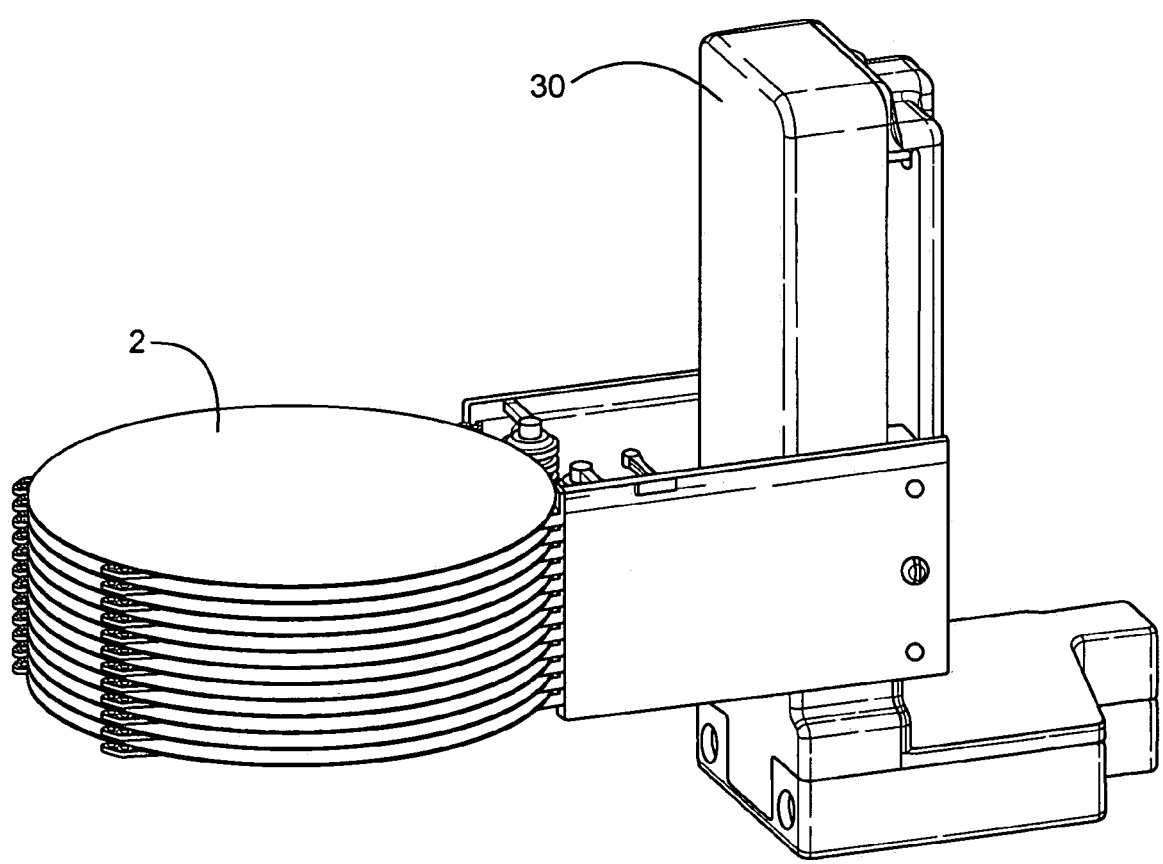
FIG. 7 is a perspective drawing of a second example of an embodiment of a gripper arm according to the invention.

The gripper arm shown in FIG. 7 comprises means for grasping the periphery of a plurality of semiconductor wafers 2, means for orienting the grasped semiconductor wafers, cooperating with grasping means so as to align the respective positioning marks of the semiconductor wafers grasped by the arm. Grasping means comprise a plurality of partial structures 7 capable of being respectively inserted in the free spaces between semiconductor wafers in a support (not shown) and connected by common rigid support 30 as shown. Each structure bears a drive roller rotating against the wafer it is intended to support, three support stops 8 for this wafer, and two beams 21 and 24, as described above for structure 7. The arm shown in FIG. 7 can be advantageously used to simultaneously grasp a plurality of wafers 2 placed in a support and advantageously simultaneously orient these wafers in such a way that they are placed in a predetermined position, for example, so as to align their notches 3. Thus alignment of the notches can take place, for example, during transfer of the wafers from one location to another.

Several examples of the methods according to the invention will now be described. A first example of the method according to the invention consists of a mechanical method enabling us to change the position of one or more semiconductor wafers provided with a notch and placed in a support intended to house a plurality of semiconductor wafers, which consists of grasping the semiconductor wafer or wafers by their periphery and orienting the semiconductor wafer or wafers so as to place its (their) notch(es) in a predetermined position. Such a method can, for example, be implemented with a device according to the invention as described above, which enables us to align notches on semiconductor wafers placed in a support without removing those wafers from their support.

A second example of the method according to the invention consists in moving the semiconductor wafer or wafers from one location to another and simultaneously orienting these wafers so as to place their notches in a predetermined position, for example, by aligning the notches. Such a method can be implemented using a wafer transfer device as described above.

What is claimed is:

1. An apparatus for accessing and gripping disc-shaped wafers supported in a housing and having peripheral position indicators, comprising:
    a rigid support structure, said rigid support structure being dimensioned to enable movement into and out of said housing between adjacent wafers without physically engaging said wafers;
    a plurality of rotatable wafer supports mounted on said rigid support structure at locations selected so as to support a said wafer on said rigid support structure only around its periphery;
    a rotatable driver mounted on said rigid structure at a position to engage said periphery of said wafer when supported by said rotatable wafer supports, and selectively operable to rotate said wafer while supported by said rotatable wafer supports to a selected radial position; and
    a first optical detector mounted on said rigid support structure, said first optical detector being operable to detect when said wafer is in said selected radial position and to generate a signal indicating the same.

2. The apparatus of claim 1 wherein said first optical detector comprises:
    a first optical emitter mounted on said rigid support structure at a first selected location relative to said periphery of said wafer, said first optical emitter being operable to emit a first light beam at said first selected location; and
    the first optical receiver mounted on said rigid support in proximity to said first selected location relative to said periphery of said wafer, said first optical receiver being operable to detect the presence and absence of said first light beam depending on the position of said peripheral position indicator relative to said first optical detector.

3. The apparatus of claim 2 wherein further comprising:
    a central unit adapted to cause the rotatable driver to stop when the first optical detector detects the selected radial position.

4. The apparatus of claim 3 wherein said peripheral position indicator includes a notch and wherein the optical detector is adapted to detect the presence of the notch when the wafer rotates.

5. The apparatus of claim 4 wherein the plurality of rotatable wafer supports includes rollers with frustoconical surfaces, and wherein the wafer supports in the plurality of wafer supports are arranged such that upward movement of the rigid support structure will cause the wafer to rest on the frustoconical surfaces of the plurality of wafer supports.

6. The apparatus of claim 4 wherein each of said wafer supports comprises an adjacent pair of rotatable rollers distributed around the periphery of said wafer, each having a shape adapted to engage only said periphery of said wafer when in contact with said wafer, said adjacent pair of rollers being spaced by a distance greater than the dimension of a said peripheral position indicator on a said wafer, and wherein the contact surfaces of the pair of rollers form a tangent to an edge of the wafer when the wafer is disposed on the contact surfaces of the pair of rollers.

7. The apparatus of claim 1 wherein said rotatable driver is responsive to said signal indicating said wafer is in said selected radial position to stop rotating said wafer.

8. The apparatus of claim 1, further comprising:
    a wafer guide mounted on said rigid support structure, said wafer guide being operable to detect a position of said wafer relative to said rigid support structure and to generate at least one signal indicating the same.

9. The apparatus of claim 8 wherein said wafer guide is operable to detect the position of said wafer relative to said rigid support structure as said rigid structure and said wafer approach in substantially parallel planes.

10. The apparatus of claim 9 wherein said wafer guide is operable to detect the position of said wafer relative to said rigid support structure in X and Y directions in a substantially horizontal plane.

11. The apparatus of claim 8 wherein said wafer guide comprises:
    a second optical detector mounted on said rigid structure at a selected location a predetermined distance from said first optical detector, said second optical detector being operable independently of said first optical detector to detect the presence and absence of said periphery of said wafer, and to generate at least one signal indicating the same.

12. The apparatus of claim 11 wherein said second optical detector comprises:
    a second optical emitter mounted on said rigid support structure at a second selected position a predetermined distance from said first optical emitter, and being selectively operable independent of said first optical emitter to emit a second light beam at said second selected position; and
    a second optical receiver mounted on said rigid support structure in proximity to said second selected position, said second optical receiver being selectively operable independently of said first optical receiver to detect the presence and absence of said second light beam, and to generate at least one signal indicating the same, said signal indicating the presence and absence of said periphery of said wafer relative to said second selected position on said rigid structure.

13. The apparatus of claim 12 wherein:
    said second optical emitter is mounted on said rigid support structure on one side of said wafer; and
    said second optical receiver is mounted on said rigid support structure on the opposite side of said wafer opposite said first optical emitter;
    whereby as said rigid structure and said wafer approach, when said periphery of said wafer has not reached said second selected position, said second light beam is not blocked by said periphery of said wafer and said second light beam is received by said second receiver, and when said periphery of said wafer reaches said second selected position, said second light beam is blocked by said periphery of said wafer and is not received by said second optical receiver, and said second optical receiver generates a signal indicating the same.

14. The apparatus of claim 11 wherein said wafer guide further comprises:
    a third optical detector mounted on said rigid structure at a selected location a predetermined distance from said first and second optical detectors, said third optical detector being operable independently of said first and second optical detectors to detect the presence and absence of said periphery of said wafer, and to generate at least one signal indicating the same.

15. The apparatus of claim 14 wherein said third optical detector comprises:
- a third optical emitter mounted on said rigid support structure at a third selected position a predetermined distance from said first and second optical emitters, and being selectively operable independent of said first and second optical emitters to emit a third light beam at said third selected position; and
- a third optical receiver mounted on said rigid support structure in proximity to said third selected position, said third optical receiver being selectively operable independently of said first and second optical receivers to detect the presence and absence of said third light beam, and to generate at least one signal indicating the same, said signal indicating the presence and absence of said periphery of said wafer relative to said third selected position on said rigid structure.

16. The apparatus of claim 15 wherein:
said third optical receiver is mounted on said rigid support structure on the opposite side of said wafer opposite said third optical emitter;
whereby as said rigid structure and said wafer approach, when said periphery of said wafer has not reached said third selected position, said third light beam is not blocked by said periphery of said wafer and said third light beam is received by said third receiver, and when said periphery of said wafer reaches said third selected position, said third light beam is blocked by said periphery of said wafer and is not received by said third optical receiver, and said third optical receiver generates a signal indicating the same.

17. The apparatus of claim 1 wherein the rigid support structure comprises:
- a pair of elongated arms having proximal and distal ends,
- a proximal support bar; and
- a distal support bar, wherein the arms in said pair of arms are connected at their respective proximal and distal ends by the proximal and distal support bars, respectively; and
- a motor on the proximal support bar, the motor being adapted to drive the rotatable driver.

18. An apparatus for accessing and gripping a plurality of adjacent disc-shaped wafers supported in a housing and having peripheral position indicators simultaneously, comprising:
- a plurality of adjacent rigid support structures, said rigid support structures each being dimensioned to enable movement into and out of said housing between adjacent wafers without physically engaging said wafers;
- a plurality of rotatable wafer supports mounted on each said rigid support structure at locations selected so as to support a said wafer on said rigid support structure only around its periphery;
- a rotatable driver mounted on each said rigid support structure at a position to engage a said periphery of a said wafer when supported by said rotatable wafer supports, and selectively operable to rotate said wafer while supported by said rotatable wafer supports to a selected radial position; and
- a first optical detector mounted on each said rigid support structure, said first optical detector being operable to detect when a said wafer is in said selected radial position and to generate a signal indicating the same.

19. The apparatus of claim 18, further comprising:
- a wafer guide mounted on each said rigid support structure, each said wafer guide being operable to detect a position of a said wafer relative to a said rigid support structure and to generate at least one signal indicating the same.

20. The apparatus of claim 19 wherein each said wafer guide is operable to detect the position of a said wafer relative to a said rigid support structure as said rigid structure and said wafer approach in substantially parallel planes.

21. The apparatus of claim 20 wherein each said wafer guide is operable to detect the position of a said wafer relative to a said rigid support structure in X and Y directions in a substantially horizontal plane.

22. The apparatus of claim 19 wherein each said wafer guide comprises:
- a second optical detector mounted on a said rigid structure at a selected location a predetermined distance from said first optical detector, said second optical detector being operable independently of said first optical detector to detect the presence and absence of said periphery of said wafer, and to generate at least one signal indicating the same.

23. The apparatus of claim 22 wherein each said wafer guide further comprises:
- a third optical detector mounted on a said rigid structure at a selected location a predetermined distance from said first and second optical detectors, said third optical detector being operable independently of said first and second optical detectors to detect the presence and absence of said periphery of said wafer, and to generate at least one signal indicating the same.

24. An apparatus for accessing and gripping disc-shaped wafers supported in a housing and having peripheral position indicators, comprising:
- a rigid support structure, said rigid support structure being dimensioned to enable movement into and out of said housing between adjacent wafers without physically engaging said wafers;
- a plurality of rotatable wafer supports mounted on said rigid support structure at locations selected so as to support a said wafer on said rigid support structure only around its periphery; and
- a rotatable driver mounted on said rigid structure at a position to engage said periphery of said wafer when supported by said rotatable wafer supports, and selectively operable to rotate said wafer while supported by said rotatable wafer supports to a selected radial position,
wherein each of said wafer supports comprises an adjacent pair of rotatable rollers distributed around the periphery of said wafer, each having a shape adapted to engage only said periphery of said wafer when in contact with said wafer, said adjacent pair of rollers being spaced by a distance greater than the dimension of a said peripheral position indicator on a said wafer.

25. The apparatus of claim 24 wherein the contact surfaces of the pair of adjacent rollers form a tangent to an edge of the wafer when the wafer is disposed on the rollers.

26. The apparatus of claim 24 wherein the rigid support structure comprises:
- a pair of elongated arms having proximal and distal ends,
- a proximal support bar; and
- a distal support bar, wherein said pair of arms are connected at their respective proximal and distal ends by the proximal and distal support bars, respectively; and
- a motor on the proximal support bar, the motor being adapted to drive the rotatable driver.

27. The apparatus of claim 24 wherein further comprising:
a central unit adapted to cause the rotatable driver to stop when a first optical detector detects a selected radial position of the wafer after being rotated by the rotatable driver.

28. The apparatus of claim 27 wherein the said wafer includes a notch and wherein the optical detector is adapted to detect the presence of the notch when the wafer rotates.

29. The apparatus of claim 24 wherein the plurality of rotatable wafer supports include rollers with frustoconical surfaces, and wherein the wafer supports in the plurality of wafer supports are arranged such that upward movement of the rigid support structure will cause the wafer to rest on the frustoconical surfaces.

30. The apparatus of claim 24 wherein the rotatable driver is a drive roller.

31. The apparatus of claim 30 wherein the driver roller comprises an O-ring having a Shore hardness rating of 70–80.

* * * * *